US009720064B2

United States Patent
Zhou et al.

(10) Patent No.: US 9,720,064 B2
(45) Date of Patent: Aug. 1, 2017

(54) VARIABLE TR (VTR) FUNCTION IN FRESH BLOOD IMAGING (FBI)

(71) Applicant: TOSHIBA MEDICAL SYSTEMS CORPORATION, Tochigi (JP)

(72) Inventors: Xiangzhi Zhou, Vernon Hills, IL (US); Mitsue Miyazaki, Des Plaines, IL (US)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 376 days.

(21) Appl. No.: 14/461,505

(22) Filed: Aug. 18, 2014

(65) Prior Publication Data

US 2016/0047871 A1    Feb. 18, 2016

(51) Int. Cl.
| | |
|---|---|
| *G01R 33/563* | (2006.01) |
| *G01R 33/28* | (2006.01) |
| *G01R 33/48* | (2006.01) |
| *G01R 33/483* | (2006.01) |
| G01R 33/561 | (2006.01) |

(52) U.S. Cl.
CPC ..... *G01R 33/5635* (2013.01); *G01R 33/4818* (2013.01); *G01R 33/4835* (2013.01); *G01R 33/288* (2013.01); *G01R 33/5617* (2013.01)

(58) Field of Classification Search
CPC ............ G01R 33/5635; G01R 33/4835; G01R 33/4814; G01R 33/5617; G01R 33/288
See application file for complete search history.

(56) References Cited

U.S. PATENT DOCUMENTS

| | | | |
|---|---|---|---|
| 5,239,266 A | 8/1993 | Kaufman et al. | |
| 2011/0115484 A1* | 5/2011 | Lee ................... | G01R 33/5635 324/309 |
| 2012/0095327 A1* | 4/2012 | Miyazaki ............. | A61B 5/0037 600/419 |
| 2015/0369891 A1* | 12/2015 | Miyazaki ........... | G01R 33/5617 324/309 |

OTHER PUBLICATIONS

Nakamura et al., "Noncontrast-enhanced Peripheral MRA: Technical Optimization of Flow-Spoiled Fresh Blood Imaging for Screening Peripheral Arterial Diseases," Magnetic Resonance in Medicine 65:595-602 (2011).

(Continued)

*Primary Examiner* — G. M. Hyder
(74) *Attorney, Agent, or Firm* — Nixon & Vanderhye P.C.

(57) ABSTRACT

A magnetic resonance imaging (MRI) system, method and/or computer readable medium is configured to obtain bright signal while having acceptable specific absorption rate (SAR) and acceptable scan time in Fast Advanced Spin Echo (FASE) or Single-shot Fast Spin Echo (SS-FSE) imaging used, for example, in non-contrast magnetic resonance angiography (NC-MRA) techniques like fresh blood imaging (FBI). Within RF pulse sequences used to acquire echo data, the TR intervals are varied in the slice encode direction. In some instances, the refocusing pulse flip angles too may be varied for RF pulse sequences such that central k-space have larger refocusing pulse flip angles than slices further towards the ends.

18 Claims, 11 Drawing Sheets

(56) References Cited

OTHER PUBLICATIONS

Tkach JA, Lin W, Duda JJ Jr., Haacke EM, Masaryk TJ, "Optimizing Three-dimensional Time-of-Flight MR Angiography with Variable Repetition Time," Radiology, Jun. 1994; vol. 191, No. 3, pp. 805-811.

Laule C, Kolind SH, Bjarnason TA, Li DK, MacKay AL, "In vivo multiecho T2 relaxation measurements using variable to decrease scan time," Magnetic Resonance Imaging., Jul. 2007; 25(6), pp. 834-839, epub May 4, 2007.

Miyazaki et al., "Non-Contrast-Enhanced MR Angiography Using 3D ECG-Synchronized Half-Fourier Fast Spin Echo", Journal of Magnetic Resonance Imaging 12:776-783 (2000).

Miyazaki et al., "Peripheral MR Angiography:Separation of Arteries from Veins with Flow-spoiled Gradient Pulses in Electrocardiography-triggered Three-dimensional Half-Fourier Fast Spin-Echo Imaging", Radiology, vol. 227, No. 3, Jun. 2003, pp. 890-896.

* cited by examiner

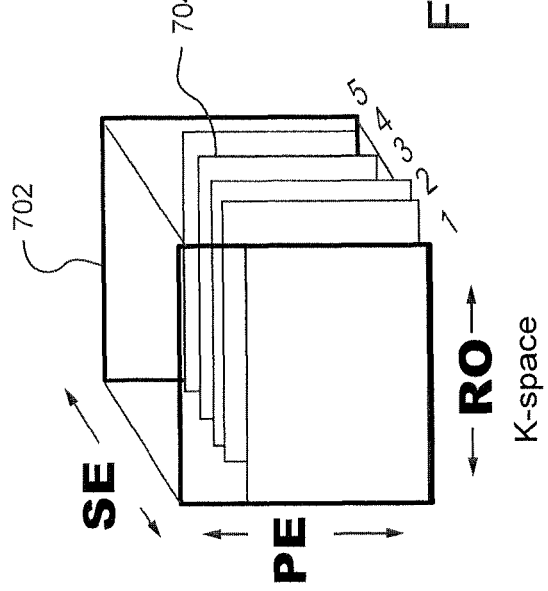
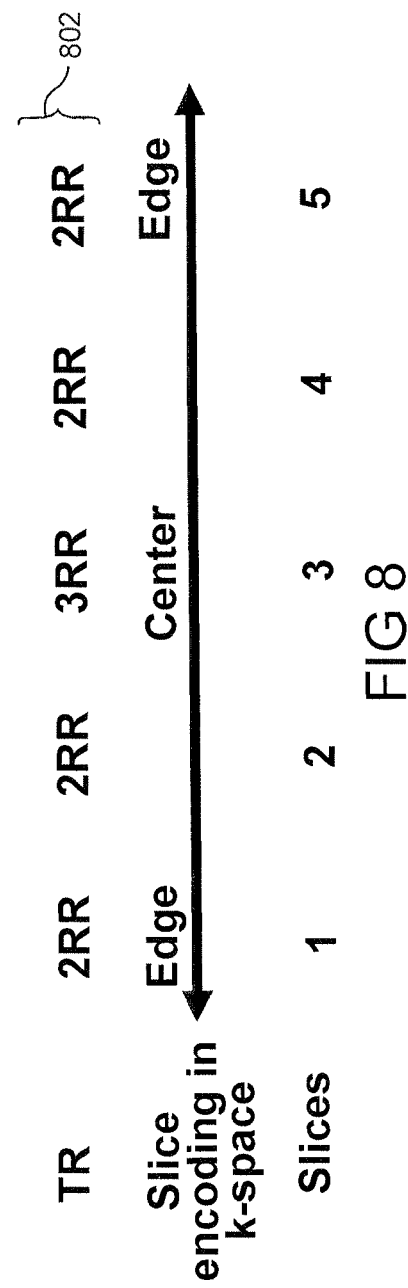
FIG. 7
FIG 8

VARIABLE TR (VTR) FUNCTION IN FRESH BLOOD IMAGING (FBI)

RELATED APPLICATION

This application is related to pending application Ser. No. 14/312,121 filed on Jun. 23, 3014 entitled, "SAR Reduction in Fast Advanced Spin Echo (FASE) or Single-Shot Fast Spin Echo (SS-FSE) Imaging" and naming as inventors Mitsue Miyazaki, Xiangzhi Zhou and Yoshimori Kassai.

FIELD

The subject matter below relates generally to magnetic resonance imaging (MRI). In particular, the subject matter relates to obtaining a sufficiently strong signal while having acceptable specific absorption rate (SAR) and scan times in Fast Advanced Spin Echo (FASE) (also known as Single-shot Fast Spin Echo (SS-FSE)) imaging used in non-contrast magnetic resonance angiography (NC-MRA) techniques such as fresh blood imaging (FBI).

BRIEF DESCRIPTION OF THE DRAWINGS

FIG. 7 schematically illustrates a three-dimensional (3D) k-space and the organization of imaging slices.

FIG. 8 illustrates another variable TR interval pattern that can be used in some embodiments.

DETAILED DESCRIPTION

Figure 1:
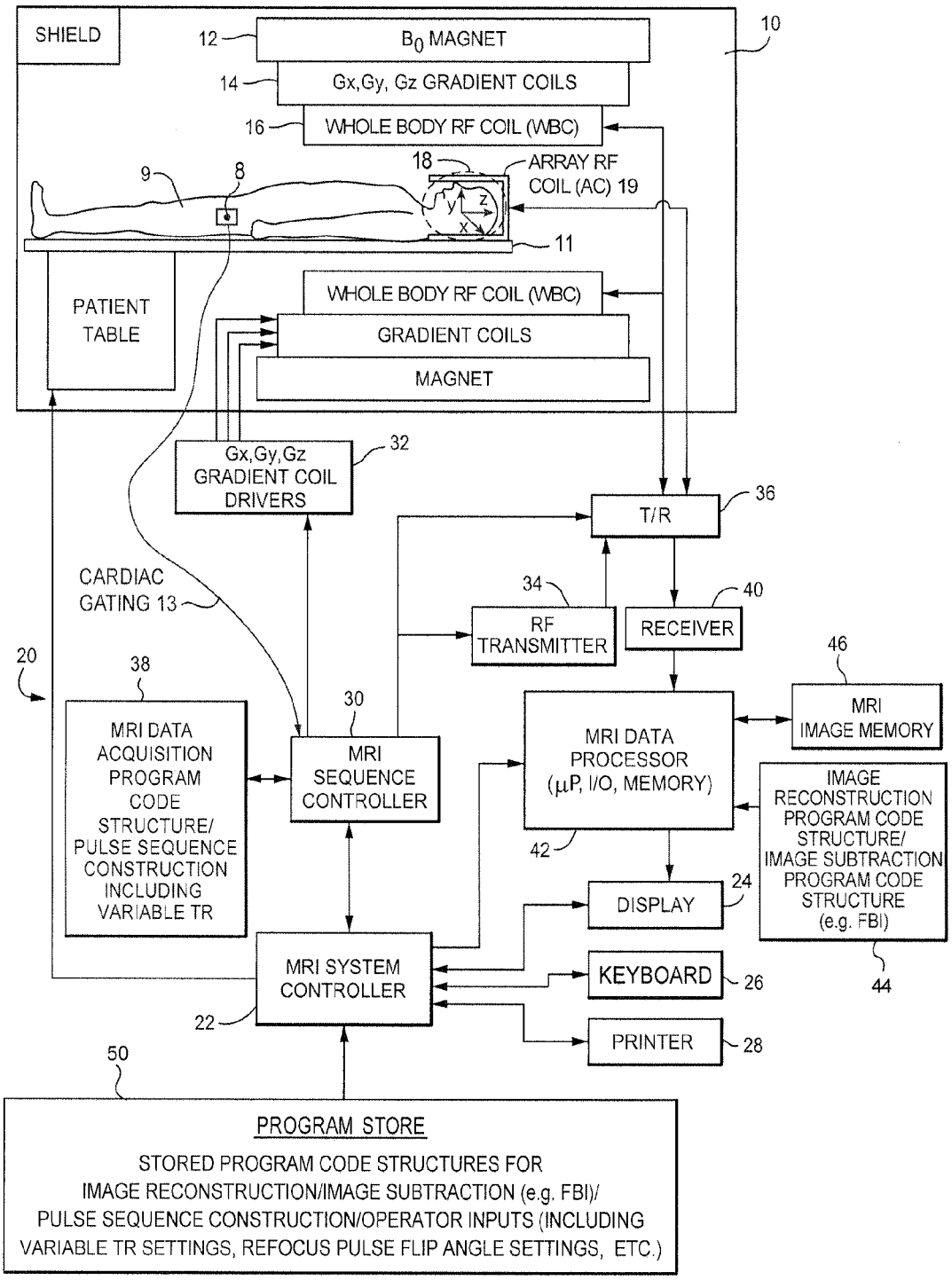
FIG. 1 is a high-level schematic block diagram of an MRI system adapted for reducing the SAR in MRI imaging using FASE sequences, in accordance with one or more embodiments.

The MRI system shown in FIG. 1 includes a gantry 10 (shown in schematic cross-section) and various related system components 20 interfaced therewith. At least the gantry 10 is typically located in a shielded room. The MRI system geometry depicted in FIG. 1 includes a substantially coaxial cylindrical arrangement of the static field $B_0$ magnet 12, a Gx, Gy and Gz gradient coil set 14 and a large whole body RF coil (WBC) assembly 16. Along the horizontal axis of this cylindrical array of elements is an imaging volume 18 shown as substantially encompassing the head of a patient 9 supported by a patient table 11. One or more smaller array RF coils 19 might be more closely coupled to the patient head in imaging volume 18. As those in the art will appreciate, compared to the WBC (whole body coil), relatively small coils and/or arrays such as surface coils or the like are often customized for particular body parts (e.g., arms, shoulders, elbows, wrists, knees, legs, chest, spine, etc.). Such smaller RF coils are herein referred to as array coils (AC) or phased array coils (PAC). These may include at least one coil configured to transmit RF signals into the imaging volume and a plurality of receiver coils configured to receive RF signals from an object, such as the patient head in the example above, in the imaging volume. A cardiac signal acquisition apparatus 8 (positioned as appropriate on the patient anatomy) may be used to provide peripheral pulsatile and/or cardiac gating signals 13 to trigger the MRI sequence controller 30.

An MRI system controller 22 has input/output ports connected to a display 24, keyboard 26 and printer 28. As will be appreciated, the display 24 may be of the touch-screen variety so that it provides control inputs as well and a mouse or other I/O device(s) may be provided.

The MRI system controller 22 interfaces with MRI sequence controller 30 which, in turn, controls the Gx, Gy and Gz gradient coil drivers 32, as well as the RF transmitter 34 and the transmit/receive switch 36 (if the same RF coil is used for both transmission and reception). The MRI sequence controller 30 includes suitable program code structure 38 for implementing MRI imaging (also known as nuclear magnetic resonance, or NMR, imaging) techniques, which may also include parallel imaging. As described below, sequence controller 30 may be configured to apply predetermined pulse sequences and/or pulse sequences formed in accordance with configuration parameters, in order to obtain NMR echo data ("echo data") from which a diagnostic MRI image is obtained. In some embodiments the pulse sequences may be, or may be similar to, Fast Advanced Spin Echo (FASE) technique which is also known as single-shot Fast Spin Echo (SS-FSE). MRI sequence controller 30 may be configured to, using cardiac gating signals from cardiac signal acquisition device 8, transmit a pulse sequence towards an area of the patient in order to separately acquire echo data corresponding to a systole and a diastole, such that a difference image can be obtained. MRI sequence controller 30 may also be configured for EPI imaging and/or parallel imaging. Moreover, MRI sequence controller 30 may facilitate one or more preparation scan (prescan) sequences, and a scan sequence to obtain a main scan MR image (sometimes referred to as the diagnostic image).

The MRI system 20 includes an RF receiver 40 providing input to data processor 42 so as to create processed image data, which is sent to display 24. The MRI data processor 42 is also configured for access to previously generated MR data, images, and/or maps, and/or system configuration parameters 46, and MRI image reconstruction/subtraction program code structures 44 and 50.

Also illustrated in FIG. 1 is a generalized depiction of an MRI system program store 50 where stored program code structures (e.g., for image reconstruction, for generation of subtracted image, etc. as described below, for simulation of selected MRI image characteristics, for post-processing MRI etc.) are stored in non-transitory computer-readable storage media accessible to the various data processing components of the MRI system. Program code may also be stored for obtaining operator input, including, for example, pulse sequence configurations including refocusing flip angle configurations for refocusing pulses in pulse sequences such as FASE, TR interval settings etc. As those in the art will appreciate, the program store 50 may be segmented and directly connected, at least in part, to different ones of the system 20 processing computers having most immediate need for such stored program code structures in their normal operation (i.e., rather than being commonly stored and connected directly to the MRI system controller 22).

Indeed, as those in the art will appreciate, the FIG. 1 depiction is a very high-level simplified diagram of a typical MRI system with some modifications so as to practice exemplary embodiments described hereinbelow. The system components can be divided into different logical collections of "boxes" and typically comprise numerous digital signal processors (DSP), microprocessors and special purpose processing circuits (e.g., for fast A/D conversions, fast Fourier transforming, array processing, etc.). Each of those processors is typically a clocked "state machine" wherein the physical data processing circuits progress from one physical state to another upon the occurrence of each clock cycle (or predetermined number of clock cycles).

Not only does the physical state of processing circuits (e.g., CPUs, registers, buffers, arithmetic units, etc.) progressively change from one clock cycle to another during the course of operation, the physical state of associated data storage media (e.g., bit storage sites in magnetic storage media) is transformed from one state to another during operation of such a system. For example, at the conclusion of an image reconstruction process and/or sometimes the generation of a subtracted image from control and tagging images, as described below, an array of computer-readable accessible data value storage sites in physical storage media will be transformed from some prior state (e.g., all uniform "zero" values or all "one" values) to a new state wherein the physical states at the physical sites of such an array vary between minimum and maximum values to represent real world physical events and conditions (e.g., the internal physical structures of a patient over an imaging volume space). As those in the art will appreciate, such arrays of stored data values represent and also constitute a physical structure—as does a particular structure of computer control program codes that, when sequentially loaded into instruction registers and executed by one or more CPUs of the MRI system 20, causes a particular sequence of operational states to occur and be transitioned through within the MRI system.

Contrast-enhanced MR techniques are routinely used in clinical settings for angiography and often provide high contrast images at fast scan times. But contrast-enhanced techniques require the infusion of a contrast agent into the patient's body. Also, achieving clear artery and vein separation, particularly in the lower extremities of the human body where arterial and venous phases can overlap, remains an area of active research in terms of the amount of contrast material and injection rate. Thus, for magnetic resonance angiography (MRA) and for many other scanning applications, non-contrast-enhanced techniques that do not use a contrast agent are useful.

3D Fast Advanced Spin Echo (FASE; FASE is also known as single-shot FSE or SS-FSE) is a frequently used sequence for non-contrast-enhanced magnetic resonance angiography (NC-MRA). 3D NC-MRA, when used, for example, with cardiac gating in fresh blood imaging (FBI), provides images where blood vessels have high signal intensity, such as in T2-weighted images.

Miyazaki et al, in "Non-Contrast-Enhanced MR Angiography Using 3D ECG-Synchronized Half-Fourier Fast Spin Echo," Journal of Magnetic Resonance Imaging, 12:776-783 (2000) (hereafter "Miyazaki-1") which is hereby incorporated by reference in its entirety, describes an NC-MRA FBI technique using an in-plane 3D half-Fourier FSE synchronized with ECG gating at every slice encoding. Miyazaki-1 describes that several aspects of the half-Fourier FSE contribute to the effectiveness of the NC-MRA FBI technique at producing bright blood depictions, as opposed to the "black blood" images produced by many FSE-related sequences. The reduction in the echo train spacing (ETS) length, the phase-encode direction being placed in the orientation of the blood vessels, and signal acquisition from near the center or low frequencies of the k-space in half-Fourier FSE are some aspects that contribute towards obtaining bright-blood images.

The reduction in the ETS length in half-Fourier FSE reduces the single-shot acquisition time, which effectively freezes motion-related artifacts and minimizes susceptibility effects. As the ETS becomes shorter, the single-shot acquisition window of half-Fourier FSE becomes shorter. Thus, when half-Fourier reconstruction is applied, the single-shot acquisition time for a 256×256 matrix may be less than 1 second.

When the phase-encode direction is placed in the orientation of the blood vessels, signal enhancement is obtained from the overlapped T2 signal blurring between the neighboring pixels, contributing to the "bright blood" signal.

Additionally, because acquisition is from near the center or low frequencies of the k-space in half-Fourier FSE, less flow dephasing, due to the smaller gradient amplitude, is obtained in the phase encode direction compared with the read-out direction.

However, the vessel specificity depends, at least to some extent, on the trigger delay time such as systolic triggering (e.g., bright vein and dark artery) and diastolic triggering (e.g., bright in both artery and vein). In fast-flow vessels, the above FBI technique shows both arteries and veins as bright blood in diastole-triggered images, whereas the technique shows black-blood arteries and bright-blood veins in systole-triggered images. In general, the above FBI technique is applied with the phase-encode direction parallel to the orientation of the vessel, and therefore, it is straightforward to obtain images of only the arteries by subtracting the systolic image from the diastolic image of fast-flow vessels.

Somewhat different to the above, in peripheral or slow flow vessels, the above FBI technique provides bright-blood arteries even in systole-triggered images because of the slow flow, which makes it difficult to separate arteries from veins. Miyazaki et al, "Peripheral MR Angiography: Separation of Arteries from Veins with Flow-spoiled Gradient Pulses in Electrocardiography-triggered Three-dimensional Half-Fourier Fast Spin-Echo Imaging," Radiology, vol. 227, No. 3, June 2003, (hereafter "Miyazaki-2") which is hereby incorporated by reference in its entirety, provides a flow-spoiled gradient approach to use the above FBI technique to obtain good images for slow flow vessels. By applying the readout direction (instead of the phase encode direction) in parallel with the vessel orientation, an intrinsic dephasing effect is obtained. Furthermore, by applying flow-spoiled gradient pulses in the readout direction, a greater flow dephasing effect is obtained.

In other words, the flow-spoiled gradient pulses do not too much affect the signal intensities of relatively immobile blood during diastole or stationary background tissues.

Therefore, subtraction of these two sets of diastolic and systolic images provides arterial images.

Flow-spoiled gradient pulses do not affect the signal intensity of stationary background tissues. In addition, veins are similarly less affected by the flow-spoiled pulses during diastole and systole as a result of their relatively constant slow flow throughout the cardiac cycle. Therefore, by applying the flow-spoiled pulses, the signal intensity difference between diastole and systole in arteries is increased. Thus, diastolic and systolic subtraction provides better delineation of the arteries. The strength of the flow spoiled gradient pulses may differ depending on the flow speed in the vessels: Arteries with slower flow necessitate use of stronger flow-spoiled gradient pulses to differentiate their signal intensities during diastole and systole.

According to Nakamura et al, "Noncontrast-enhanced Peripheral MRA: Technical Optimization of Flow-Spoiled Fresh Blood Imaging for Screening Peripheral Arterial Diseases," Magnetic Resonance in Medicine 65:595-602 (2011), which is incorporated hereby by reference in its entirety, the above described flow-spoiled FBI technique allows the depiction of the entire tree of peripheral arteries by utilizing the signal difference between systolic- and diastolic-triggered data. The image quality of the technique depends on selecting the accuracy of the triggering delay times and flow-dependent read-out spoiler gradient pulses. Nakamura et al illustrates that the flow-spoiled FBI technique offers good performance at 1.5T.

However, although FBI at 1.5T has been well established, FBI suffers from a specific absorption rate (SAR) issue and intrinsic prolonged T1 of tissue and blood at 3T. More particularly, at 3T (and/or other fields higher than 1.5T) the intrinsic prolonged T1 of tissue and blood generally requires an extended TR interval (e.g., about 4 RR intervals) in order to achieve sufficient signal to noise ratio (SNR) but, on the other hand, extending the TR interval may result in extended scanning times beyond acceptable levels.

Some embodiments described below, therefore, are directed to reducing the SAR in FBI techniques for NC-MRA such that adequate SNR is achieved while still keeping the total scan time within a time interval that does not exceed a patient's comfort zone.

More particularly, in contrast to conventional NC-MRA and/or FBI techniques which apply a constant (i.e. fixed) TR interval, embodiments provide for varying the TR interval such that the central region of k-space can be populated based on echo signals acquired with sufficiently long TR (e.g., TR interval length allowing for a preferable level of longitudinal magnetization recovery sufficient to obtain a bright signal) while simultaneously ensuring that the total scan time and SAR are acceptable. In some embodiments, in addition to varying the TR intervals, the refocusing flip angles (also referred to as "refocusing pulse flip angle" or "flop angle") are varied during a TR interval. The refocusing flip angles may be configured such that the variably-sized refocusing flip angles are symmetrically distributed about the refocusing pulse that corresponds to the center of k-space (e.g., the refocusing pulse that causes the generation of the echo signal that maps to the center of k-space).

Conventionally, to the knowledge of the inventors, variable TR intervals have not been applied in the NC-MRA techniques such as FBI. FBI, due to the acquisition of systolic and diastolic images, require relatively high scan times compared to techniques acquiring only a single acquisition. Moreover, in order to minimize distortions in the subtracted image, it is desirable that the corresponding systolic and diastolic acquisitions are acquired with identical parameters. One has to note that the TR mentioned in FBI is the repetition time for each slice encoding. It comprises trigger delay, acquisition time for one slice encoding, and the following recovery time. The TR in FBI can only be a multiple of RR intervals since FBI is an ECG gated technique. The FBI TR is thus different than the conventional concept of TR, which is usually the repetition time between RF pulses. The varying TR in FBI allows longitudinal magnetization to be recovered at different levels after each slice encoding readout.

Figure 2:
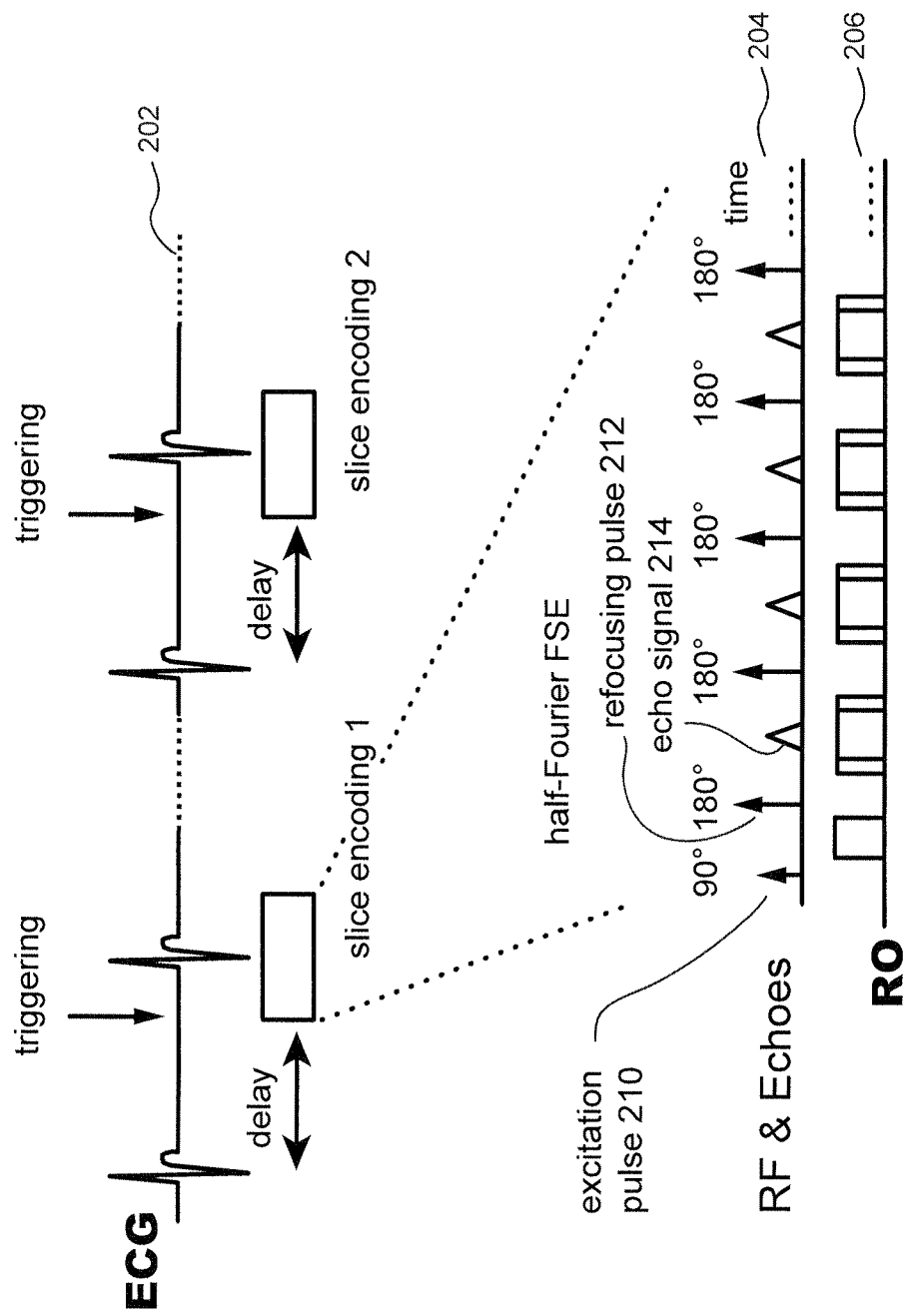
FIG. 2 illustrates a conventional pulse sequence used for FASE imaging.

FIG. 2 illustrates a conventional pulse sequence for FASE (or FSE), such as a pulse sequence used for the flow-spoiled FBI technique discussed above. ECG R-wave 202 is used for cardiac gating, such that data acquisitions for systole and diastole can be acquired at respectively consistent instances during cardiac cycles. Triggering points at which imaging data acquisition is initiated are also illustrated in relation to the R-wave. Data acquisition occurs after a lapse of a specified trigger delay period from an R-wave, and is conventionally configured to occur with a fixed predetermined interval (e.g., one data acquisition every 2 RR intervals). The 3D half-Fourier FSE sequence is ECG synchronized for each slice encoding to have the same cardiac phase in every slice partition. FIG. 2 illustrates a slice encoding 1 and a slice encoding 2 based upon R-waves 202, and also provides a schematic illustration of the RF pulse sequence and corresponding echo train 204, and the corresponding flow-spoiled gradients 206 in the readout direction.

Each triggering initiates a slice encoding by transmitting a pulse sequence, such as a FASE pulse sequence, towards the object being imaged. As illustrated, the RF pulse sequence for a slice encoding (e.g., slice encoding 1) includes one or more pulse trains in which a pulse train includes an excitation pulse and a plurality of consecutive refocusing pulses that follow the excitation pulse in time. The excitation pulse 210 may be configured for a 90 degree excitation flip angle and each refocusing pulse 212 is configured with a 180 degree refocusing flip angle. One resulting echo signal 214 is acquired for each refocusing pulse. A person of skill in the art will understand, for example, that the strength (e.g., amplitude) of the echo can be changed by changing the refocusing flip angle. As those in the art will also understand, the amplitude, duration and frequency of the RF excitation and refocusing pulses contribute to the SAR.

FIG. 2 also illustrates gradients 206 applied in the readout direction in order to acquire the echo signals shown at 214. The illustrated gradients are flow-spoiled gradients (which include flow-spoil components to either side of the actual readout gradient). Miyazaki-2 further describes the flow-spoiled gradients, their configuration and effects.

Figure 3:
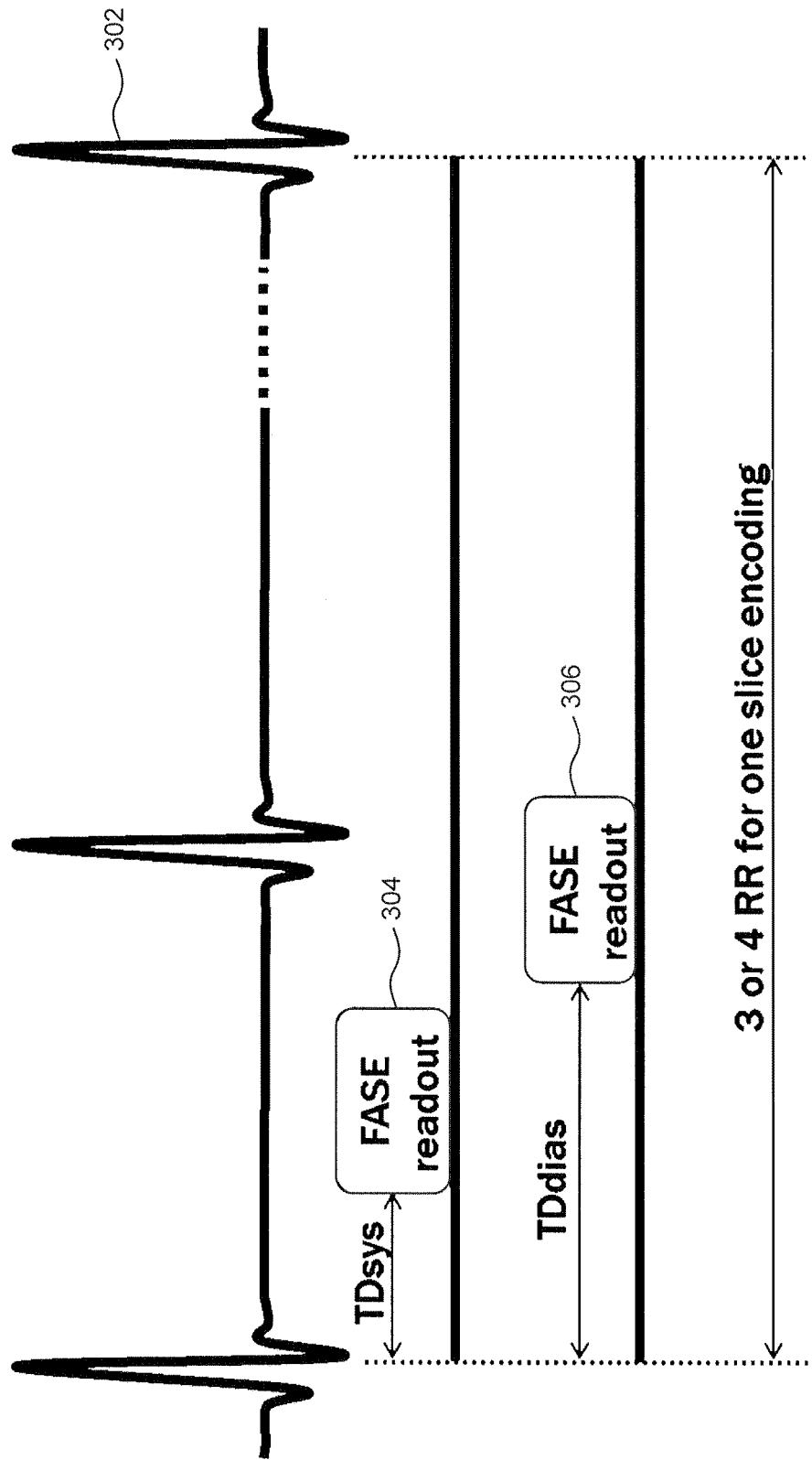
FIG. 3 is illustrates the FASE sequence being used to obtain FBI.

FIG. 3 schematically illustrates the arrangement of a systolic FASE readout 304 and corresponding diastolic readout 306 in relation to the R-wave. As illustrated in FIG. 3, conventionally, one slice encoding may be acquired every three or four RR intervals (i.e., duration between two consecutive R-wave peaks) based on configuration. As used herein, the "TR interval" includes the delay from the R-wave trigger (e.g., R-wave peak) to the readout, duration of 3D FASE readout and the recovery time until the next R-wave trigger.

Conventionally, the TR interval can be 2RR, 3RR, 4RR or 5RR, but once it is set for an NC-MRA scan such as FBI, it remains fixed for the entire scan. The lower limit of the TR interval duration depends on the SAR. For patients with high heart rate, the TR interval may require a larger number of RR intervals. The upper limit of the TR interval duration depends on how much recovery of the longitudinal magnetization recovery is desired by the operator.

Figure 4:
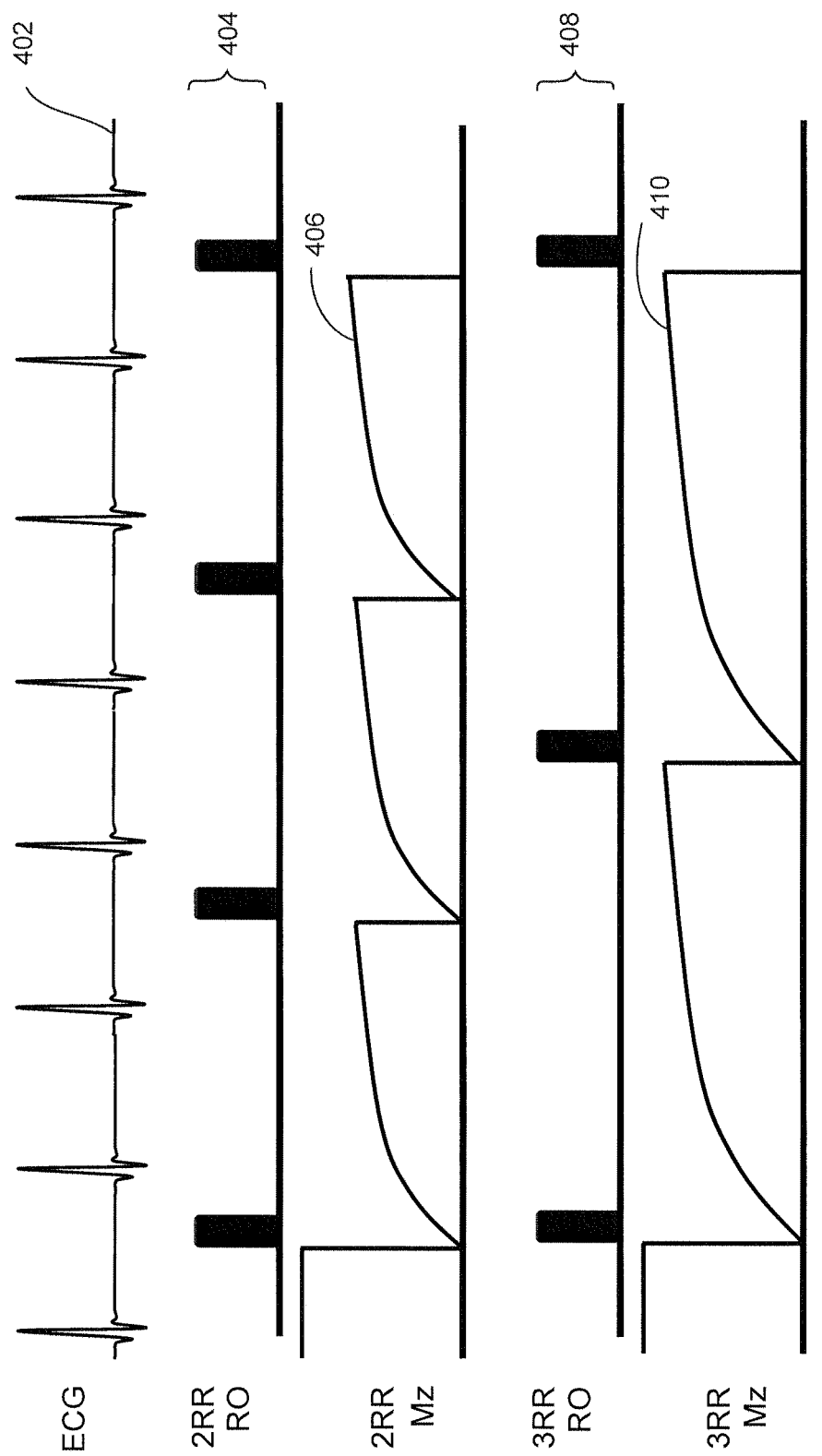
FIG. 4 is a schematic illustration of the relationship between the length of the TR interval on longitudinal magnetization recovery.

FIG. 4 schematically illustrates the relationship between RR intervals and longitudinal magnetization. The level of longitudinal magnetization recovery increases with elapsed time up to a certain time period after excitation until full relaxation occurs. Thus, as illustrated, the longer the elapsed time between the excitation pulse and the readout, the greater the T1 relaxation of NMR magnetization towards the quiescent z-axis orientation (sometimes referred to as the longitudinal magnetization). As the TR interval increases from 2RR to 3RR, for example, the recovery towards the static z-axis field is higher and consequently the resulting next TR interval transverse magnetization echoes will be stronger.

Readout gradient sequence 404, determined based upon the ECG-gated R-wave 402, illustrates a readout obtained every 2RR. The curve 406 represents the longitudinal magnetization recovery at a TR interval of 2RR. The curve 410 represents the longitudinal magnetization recovery obtained when the TR interval is at 3RR. In the illustrated portion, both 406 and 410 start (at the left end in the drawing) at full longitudinal magnetization strength. It can be clearly seen that the difference between starting longitudinal magnetization for the first readout (i.e., the readout shown most to the left) and subsequent readouts is greater (i.e., the subsequent readouts experience less longitudinal magnetization recovery before starting a new TR interval) in 406 when compared to 410. Thus, FIG. 4 illustrates the that stronger signals are acquired at a TR interval of 3RR when compared to a TR interval of 2RR. However, using 3RR for the TR interval results in elongating the scan time when compared to 2RR.

In 3D FBI imaging according to conventional techniques, especially at 3T, the SAR becoming too high (e.g., beyond recommended/desired safety limits) can be a problem. Whereas a long TR is required in order to have a high SNR (e.g., to display "bright blood" with sufficient clarity) of blood vessels, the resulting elongated scan time limitations may discourage the use of such long TR. Short TR, although shortening the scan time, may give rise to SAR concerns (i.e., because of a greater frequency of RF pulses). Similarly, whereas high refocusing flip angles may be required in order to have a high SNR of blood vessels, SAR limitations may restrict using high refocusing flip angles.

In order to have a SAR within a desired range for a 3D FBI scan and yet maintain sufficiently high blood signal, embodiments herein use variable TR intervals. For slices that contribute most to the k-space center region, the TR interval is set higher than for those slices that contribute little or none to the k-space center region. Additionally, in some embodiments, for each slice, the TR interval may be varied so that the scans that contribute most to the k-space center (i.e., when considering each slice, the k-space center may be the 2D center of each slice) have a longer TR interval than others. The pulse sequences are configured such that the TR interval lengths in corresponding systolic and diastolic acquisitions are matched in order to minimize background tissue differences.

Variable refocusing flip angles in a single-shot (e.g., in each or many slice encoding shots) may also be used in the pulse sequences. The variable refocusing flip angles may have high refocusing flip angles(s) at or near the K-space center (e.g., for corresponding the respective slices) to maintain high blood vessel signals. At or near the center of K-space slice encoding, high refocusing flip angles are used and peripheral slice encoding has lower refocusing flip angle pulses. Some preferred embodiments apply the variable refocusing flip angles in 3D FASE sequences in both the phase encode direction and in the slice encode direction (i.e., 2D variation in refocusing flip angle pulses.

Variable refocusing flip angles for refocusing pulses can be arranged in any of many possible patterns, such as, for example: a pattern of variable refocusing flip angles in every shot; a high variable refocusing flip angle at the center of slice encoding and the rest of slice encoding using lower refocusing flip angles; a high variable refocusing flip angle at the center of slice encoding and the rest of slice encodings using somewhat moderate high variable refocusing flip angles; a high variable refocusing flip angle at the center of slice encoding areas and the rest of slice encodings using lower refocusing flip angles; and a high variable refocusing flip angle at the center of slice encoding areas and the rest of slice encodings using somewhat moderately high variable refocusing flip angles. In some embodiments, the refocusing pulses are configured such that variably-sized high refocusing pulse flip angles are distributed substantially symmetrically about the refocusing pulse for which the corresponding echo signal maps to the k-space center.

In contrast to conventional techniques, example embodiments provide advantages including, for example, reduced SAR due to shorter TR intervals compared to fixed TR interval sequences, reduced motion artifacts due to shorter scan times, acceptable scan times while still yielding a strong signal (especially at high field strengths), and reduced SNR of tissue by acquiring strong signals at k-space center. Also, some embodiments provide the advantages of smaller refocusing flip angles for some (e.g., the outer) k-space lines, maintaining sufficient SNR of blood signal because the center k-space lines use larger refocusing flip angles, and reducing TR (and thus reducing scan time).

Figure 5:
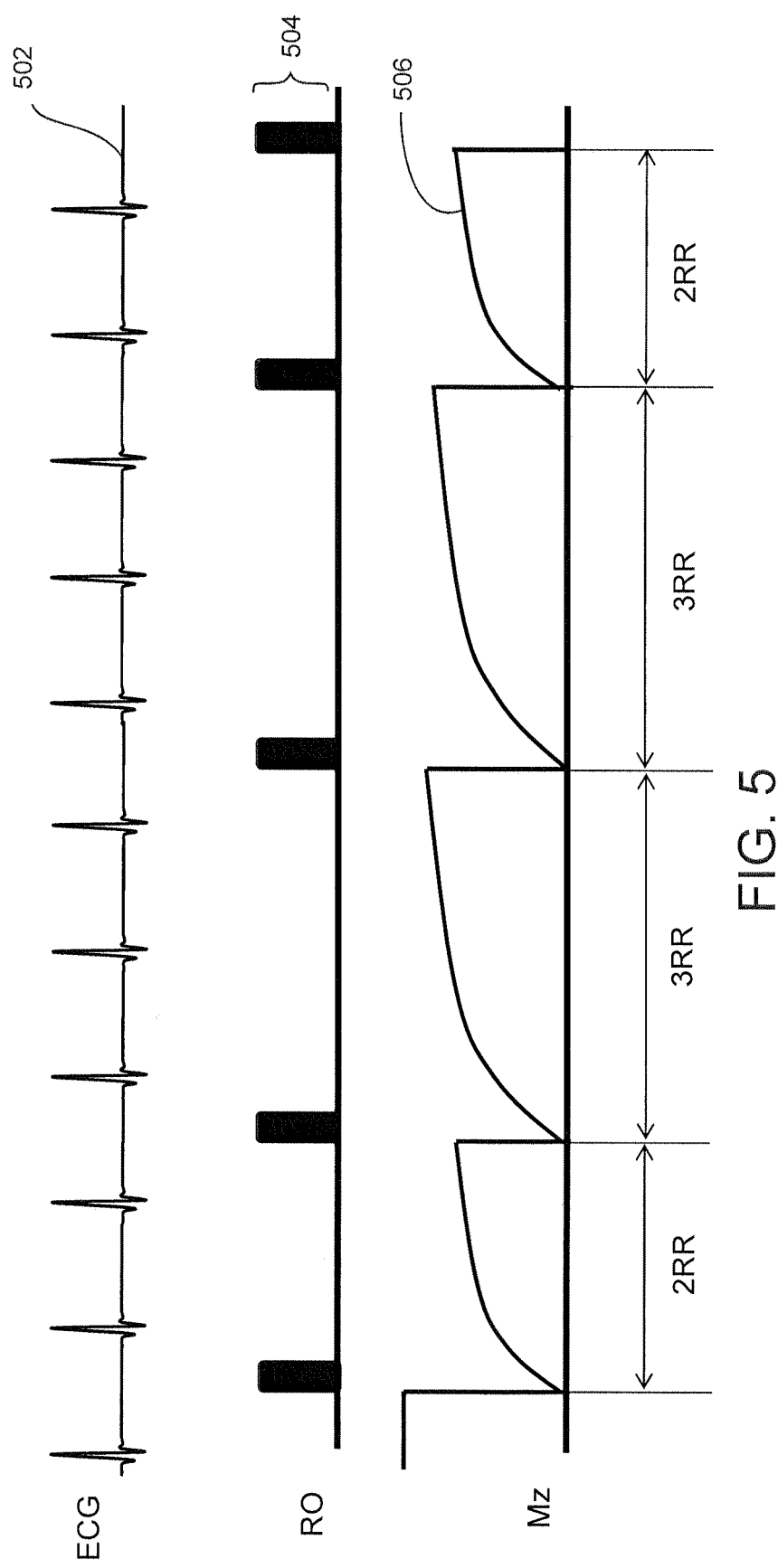
FIG. 5 is a schematic illustration of variable TR intervals, according to an embodiment.

FIG. 5 schematically illustrates a variable TR arrangement in accordance with some embodiments. Four consecutive TR intervals are shown as having lengths 2RR, 3RR, 3RR and 2RR. The RR intervals are measured in relation to R-wave 502. 504 illustrates the occurrence of readouts in relation to R-wave 502. The curve 506 graphically illustrates that the level of recovery obtainable from the TR of 3RR duration is greater than the level of recovery obtainable from TR of 2RR duration. The variable TR interval arrangement shown in FIG. 5 may be applied to selected slices in the slice encode direction. At the end of each RO (fast spin echo train) the longitudinal magnetization Mz is almost zero due to T2 decay, so in FIG. 5 for simplification it is assumed that Mz starts from zero after each RO. As illustrated in FIG. 5, each RO interval may commence immediately after the longitudinal magnetization is flipped.

Figure 6:
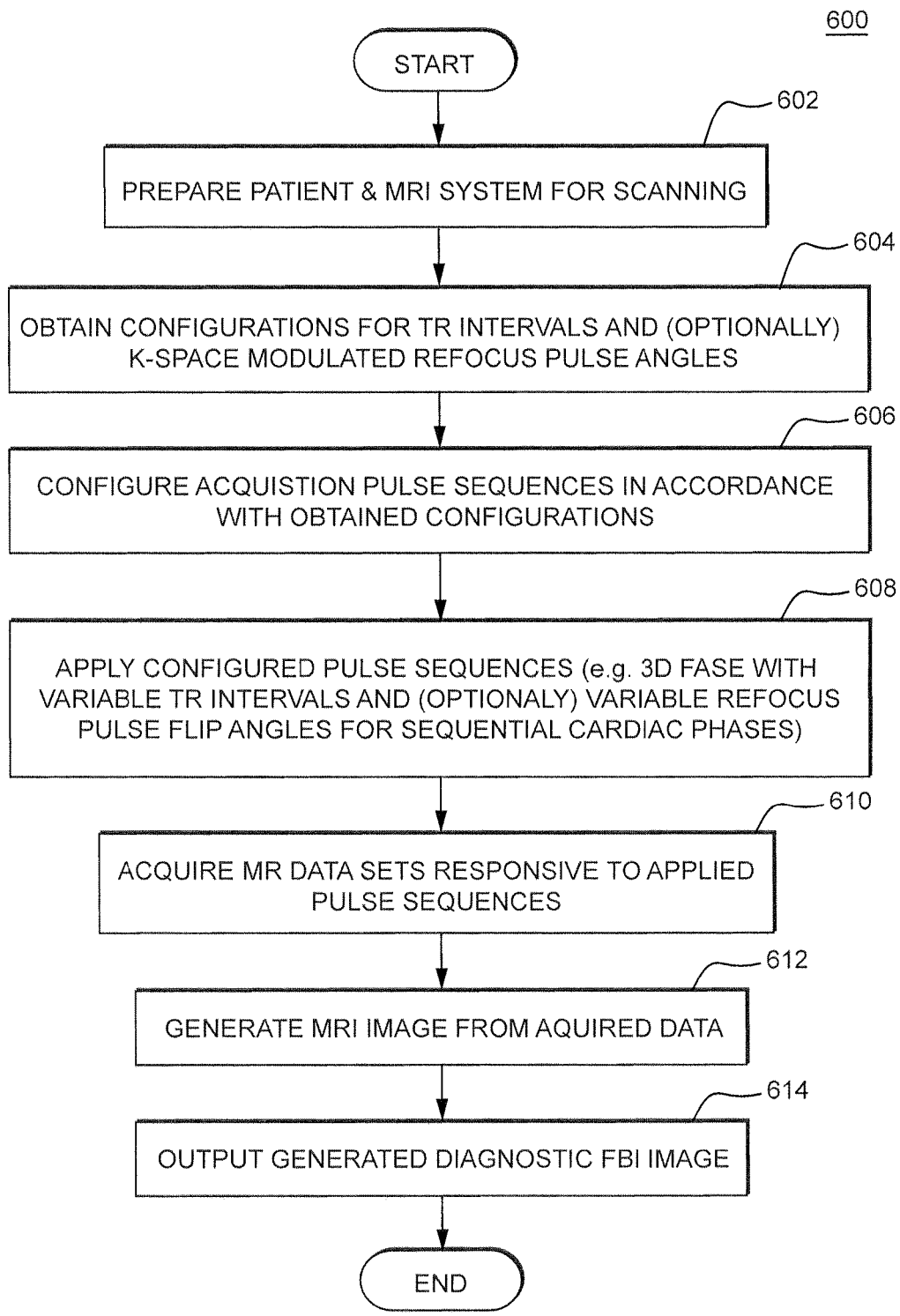
FIG. 6 illustrates a flowchart for obtaining sufficient signal while having acceptable SAR and scan times in FASE imaging using variable TR intervals, according to one or more embodiments.

FIG. 6 illustrates a flowchart of a process 600 for reducing the SAR in FASE imaging, for example, in FBI imaging, according to one or more embodiments. The process 600 may be performed by an MRI system, such as, for example, the MRI system shown in FIG. 1. It will be appreciated by those in the art that one or more of the operations 602-614 may be performed in an order other than that shown, may not be performed or may be combined with one or more other operations when performing process 600.

After entering process 600, at operation 602 the patient and the MRI system are prepared for scanning. Operation 602 may include positioning the patient and/or the part of the patient to be imaged in relation to transmit and/or receive RF coils of the MRI system, and setting of general parameters and/or configuration options for performing imaging. In example embodiments techniques described herein can be applied to image many parts of the patient, such as, but not limited to, head, neck, heart, lungs, kidneys, legs, iliac, femoral, calf, foot, hand and/or other areas in which blood vessels are to be examined, with appropriate configurations of the system and positioning of the patient. As described below, certain configurations, such as, for example, pulse sequences, slice locations and sizes, can be adjusted in a respective manner based upon selected characteristics of the object image. For example, configurations may be set and/or adjusted in accordance with the flow speed of the vessel or specific part of the body or organ being imaged.

The preparation stage may, in some embodiments, also include acquiring one or more prescans, for example, to obtain one or more low resolution MRI images for positioning the patient and/or coil calibration. In some embodiments, one or more ECG preparatory scans may be performed in order to determine appropriate ECG delay times for systole and diastole for the vessel(s) of interest (e.g. vessel(s)/area to be imaged) from the acquired images, and the selected delay time is later applied in the diagnostic 3D half-Fourier FASE acquisition synchronized by ECG gating for every slice encoding. In some embodiments, additional prescans may be performed, for example, to determine flow-spoiled gradient pulse strength based upon prescan images. Miyazaki-2 further describes preparation scans such as those noted above, which may be used in example embodiments.

At operation 604, configuration parameters are obtained for variable TR. Shortening the TR interval would reduce scan time, but increase SAR associated with the scan and reduce the SNR. A longer TR interval would extend the scan time, but decrease SAR and increase the strength of the acquired signal. Having a fixed long TR so that a good signal is obtained even at high magnetic fields (e.g. at 3T) may lead to a total scan time that exceeds a time period in which a patient can be expected to remain steady for scanning purposes. A fixed short TR in order to reduce the total scan time may lead to SAR related issues, such as having a SAR too high for at least some patients. In embodiments, the operator may provide a variable TR configuration such that the signal strength at low frequency signals (e.g., at center k-space) are acquired at relatively long TR intervals while still maintaining the overall length of the scan at an acceptable duration.

Configuration parameters may specify, among other things, the volume for scanning and the sequences applied. Configuration parameters may be used to specify a number of slices and a size of each slice. FIG. 7 schematically illustrates a k-space 702 half-plus filled with NMR echo data according to a half-Fourier technique. In the example, the area of k-space 702 includes the echo data acquired for five slices. As illustrated in FIG. 7, a readout (RO) direction, a phase encode (PE) direction, and a slice encode (SE) direction (e.g., kx, ky, kz, respectively) may be defined with regard to k-space 702.

When considering a slice (e.g., a 2D plane), the center of k-space for the slice is the central region of the slice (e.g., for slice 704, the center in slice 704 in the PE direction). When considering a plurality of slices (e.g., a stack of slices or 3D volume such as slices 1-5) the center of k-space is the center of the 3D volume (e.g., slice 3). The "k-space center" may not necessarily refer to only a single line in a slice or to only a single slice, and may refer to one or more lines and/or slices nearest the k-space center.

Returning to FIG. 6 and configuration at operation 606, the operator may provide configuration parameters such that two or more different TR interval lengths are specified for encoding slices. A number or percentage of the slices to be encoded at each TR interval length may also be specified. In some embodiments, the user may identify a TR interval length for each slice, or each group of slices. In some embodiments, the operator determined a minimum TR interval length, and then based upon the minimum, a TR interval length desirable for the k-space center can be determined. The minimum TR interval can be determined, for example, using a reasonable refocusing pulse flip angle in the range of 120-160 degrees and/or a reasonable parallel imaging factor of 2-4.

The operator may specify a two level variable TR pattern which provides long TR at the k-space center and short TR everywhere else. The length of TR for each level, and the number of slices to be encoded at each level may be configured. For example, in 20% of the slices in the k-space center may be configured for a longer TR interval.

In some embodiments, the configured variable TR pattern may be more complex, with the largest TR being at k-space center, and two or more levels of gradually shorter TR configured for respective slices as their location moves away from the k-space center. The pattern may be symmetric about the k-space center. For each level, the length of TR and the number of slices may be configured.

The operator may specify the configurations by manually entering the respective patterns, by selecting pre-stored patterns from a table, or by a combination of both. In some embodiments, the MRI system may, based upon available information regarding the patient, selectively suggest one or more configurations for acceptance by the operator. For example, some embodiments may include a user interface (UI) that enables the user to select variable TR patterns previously used and/or automatically determined (e.g., based upon scout scans and/or patient information) to assign to respective slices.

In some embodiments, in addition to variable TR configurations, the operator may also configure variable refocusing flip angles. Variable refocusing pulse flip angles can be advantageously used when, for example, even after variable TR configuration, it is found to be necessary and/or desirable to further reduce the SAR and/or the total scan time. One or more TR intervals may be reduced by offsetting the resulting increase in SAR by having at least some of the refocusing flip angles being made smaller. The operator may provide configurations associated with the variable refocusing flip angles by selecting from a pre-stored table of parameters and/or by use specifying a pattern of refocusing flip angles for one or more of a plurality of pulse sequences that are to be applied to respective slices and/or applied to respective sets of k-space lines for a single slice. Some embodiments may provide a UI by which the operator can individually select one or more refocusing pulse flip angles in one or more provided FASE pulse sequences, and, individually or in groups, provide a refocusing flip angle for selected pulses. In some embodiments, the user may specify a refocusing flip angle for only the refocusing pulse corresponding to effective TE ($TE_{effective}$) for which the responsive echo signal will be recorded in the k-space center.

The examples provided above with respect to configurations are illustrative, but a person of skill in the art will appreciate that configurations related to the refocusing flip angles can be specified in many other ways.

At operation 606, acquisition pulse sequences are formed based upon the obtained configuration parameters. The pulse sequences are formed such that pulse sequences contributing most to the k-space center are assigned longer TR intervals than other pulse sequences. For example, the TR interval for each slice may be set, based upon configuration parameters, such that a specified number of slices at the k-space center have a longer TR interval than other slices. In another embodiment, the formed pulse sequences have the longest TR interval for a specified number of slices at the k-space center, and two or more levels of decreasing shorter TR intervals symmetrically assigned to slices as their location move away from the k-space center.

The pulse sequences are configured so that the slices nearest the 3D center of k-space have the largest TR intervals. Further configuration may provide for slices at the peripheries having the shortest TR interval and/or those in between being arranged such that the slice TR intervals do not increase going from the center to the peripheries of k-space.

If the operator indicated that variable refocusing pulse flip angles are also to be configured in addition to the variable TR, pulse sequence may also be formed to include variable refocusing pulse flip angles. Basically, the refocusing pulses contributing to the central region of k-space are configured to have the largest refocusing flip angles. The refocusing pulses in each pulse sequence may be arranged so that (1) for each slice, the highest refocusing flip angles are assigned to the pulses closest to the center k-space, the lowest refocusing flip angles are assigned to the pulses furthest from the center k-space, and/or intermediate refocusing flip angles are assigned to pulses such that the size of the refocusing flip angle does not increase going from the center to the peripheries of k-space, and (2) between slices, slices at the 3D center k-space have the largest refocusing flip angles, whereas slices at the peripheries have the smallest refocusing flip angles, and/or the refocusing flip angles at the 2D center of slices do not increase going from the center k-space to the peripheries.

Other arrangements of variable TR and variable refocusing flip angles are possible and are contemplated as embodiments. For example, arrangements may be provided where, while the k-space center region does include echo data from high refocusing flip angles one or more other areas outside of the center region may also include echo data from high refocusing flip angles (e.g., when such a configuration is still within the acceptable SAR ranges and scan times).

The forming of the pulse sequences in accordance with configuration parameters may be achieved by using one or more predetermined lookup tables stored in the memory of a computer associated with the MRI system (e.g., predetermined lookup table storing default refocusing flip angles for any refocusing pulse and/or respective refocusing pulses of a pulse sequence), by using a predetermined algorithmic function to determine refocusing flip angles for respective refocusing pulses when one or more of a maximum refocusing flip angle, a minimum refocusing flip angle, and a number of refocusing pulses are specified, or by using pulse sequences as they were specified by users (e.g., where the operator specified refocusing flip angles for one or more selected refocusing pulses, and the others have predetermined default values).

At operation 608, the configured pulse sequences are applied. The application may include applying each pulse sequence twice to a slice—a first time to obtain echo signals for the systole and a second time to obtain echo signals for diastole. The application may include transmitting RF pulses according to 3D FASE pulse sequence(s), as configured at operation 606, towards a selected area of the patient.

According to an embodiment, an RF pulse FASE sequence, such as the FASE pulse sequence 204 shown in FIG. 2, is applied to an object being imaged, and an echo train (e.g., train of echo signals 214) is generated with a respective echo being generated in response to each refocusing pulse (e.g., refocusing pulse 212) in the FASE sequence 204. The applied FASE sequence 204 includes an excitation pulse 210, and a plurality of subsequent refocusing pulses, such as 212. An echo train comprising a respective echo (e.g., 214) in response to each refocusing pulse is produced.

The slices which contribute to k-space center are preferably configured for longer TR than slices at the peripheries of k-space. As described above, there may be two or more unique TR interval lengths used by respective pulse sequences. When variable refocusing flip angles are used in addition to the variable TR intervals, one of the RF refocusing pulses in each pulse sequence may be identified as causing the echo signal mapped to the center of k-space (e.g. effective TE echo) has a larger refocusing flip angle than other refocusing pulses because of its encoding to the important center of k-space. As described above, as the refocusing flip angle gets larger, the corresponding echo signal becomes stronger (i.e., higher amplitude) and SNR increases.

A 3D FASE sequence is applied to the imaging volume of plural slices. In some embodiments, the first slice encoding may be acquired for the k-space center in order to take advantage of the availability of the fully recovered longitudinal magnetization. Echo signal trains are obtained in response to FASE pulse sequence 304 applied to respective slices (e.g., slices 1-5). Each FASE pulse sequence comprises an excitation pulse, and a plurality of subsequent refocusing pulses. As those in the art will appreciate, the PE and SE axes as shown schematically in FIG. 7 also have time domain coordinates. Within each slice 1-5, an echo train (not shown) is produced in response to the corresponding RF pulse sequence. The echo train generated for a particular RF pulse sequence includes a respective echo signal generated in response to each refocusing pulse. In a 3D FASE sequence, the effective TE for that single-shot sequence is preferably achieved at or very near the k-space center (i.e., the nearest to k-space center among echoes in the echo train).

FIG. 8 illustrates a variable TR interval pattern 802 that may be used in some embodiments in combination with a variable refocusing flip angle for refocusing pulses. Pattern 802 illustrates that, in a 3D k-space where slices 1-5 are arranged sequentially (e.g., as shown in k-space 702), the FSE pulse sequences for each of slices 1 and 5, which are furthest from the k-space center are acquired with a TR interval of 2RR, and slices 2-4 are each acquired with a TR interval of 3RR. Thus, pattern 802 illustrates a 2 level variable TR interval arrangement where the slices closest to the k-space center are assigned the higher TR interval and the other slices being assigned the lower TR interval.

The total scan time is determined as the summation of times to acquire (e.g. encode) each of the slices being imaged. Thus, when a fixed TR is used for all slice encodings, then the total scan time is based upon the product of the summed TR intervals for one slice and the number of slices. When the TR intervals vary for some slices, then the total scan time is expressed as the summation of the TR intervals of the respective slices.

The TR interval, as used in some embodiments, include the delay from R-wave trigger, 3D FASE readout and the recovery time until the next R-wave trigger. In some example embodiments, the TR interval for selected slices is changed by changing the time to obtain the FASE readout. Specifically, in some embodiments, the interval between consecutive refocusing pulses (and correspondingly the interval between readout gradients) is changed such that in the shorter TR intervals the echo signal demonstrates less longitudinal magnetization recovery and in the longer TR intervals the echo signal demonstrates a stronger longitudinal magnetization recovery. Thus, TR with 3RR between readouts gives higher longitudinal magnetization recovery than 2RR, however, TR with 3RR between readouts requires longer scan time.

SAR is related to TR, and shorter TR makes higher SAR in an FBI scan. In FBI, the total scan time is proportional to the number of slice encodings and the TR for one total slice encoding. In conventional FBI, each slice encoding happens within a fixed TR. As noted above, TR includes the delay from R-wave trigger, 3D FASE readout and the recovery time until the next R-wave trigger. In conventional applications, TR is fixed at any of the lengths, such as, for example, 2RR, 3RR, 4RR or 5RR, and once a value for TR is set, the same TR will be used throughout the scan. Generally, the lower limit of number of RR depends on the SAR. For patient with high heart rate, extra RR is needed to reduce the SAR.

Figure 9:
FIG. 9 illustrates a multi-level variable TR interval pattern that can be used in some embodiments.

FIG. 9 illustrates another variable TR interval pattern that can be used in some embodiments. The pattern 902 shown in FIG. 9 is a multi-level pattern with more than two different TR intervals being used when encoding a plurality of slices. As shown in FIG. 9 the pattern 902 may include the longest TR interval (e.g., 5RR) in the slice(s) nearest the center of k-space in the SE direction, and the other slices may be configured with non-increasing TR intervals as the slice position changes from the center of k-space to the peripheries or edges of k-space. As shown in FIG. 9, this general pattern of configuring the most central (to k-space) slices to have the largest TR interval, and the slices at the edges to have the smallest TR interval, can be generalized such that each TR is assigned to a predetermined number of consecutive slices. For example, in accordance with the "repetition number" series shown in FIG. 9, the d, most central (to k-space), slices are assigned a 5RR TR, c consecutive slices to either side of the 5RR slice(s) are assigned a TR of 4RR, the next b consecutive slices after each set of 4RR slices are assigned 3RR, and a last slices at either side are assigned 2RR. The changes to TR interval can be made in the slice encode direction.

Figure 10:
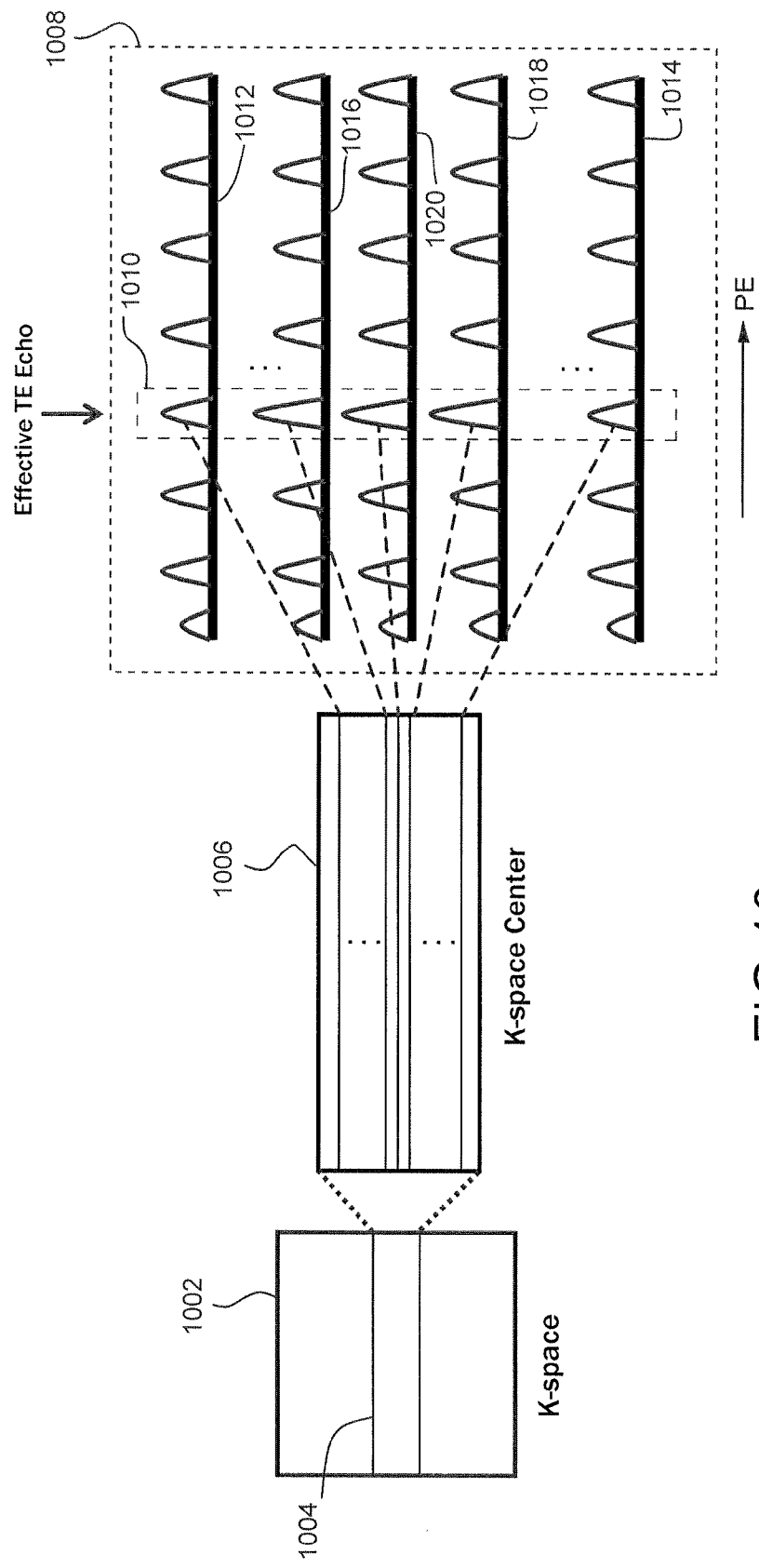
FIG. 10 illustrates a variable refocusing flip angle applied in two-dimensions (2D), in accordance with some embodiments.

FIG. 10 schematically illustrates a center area 1004 in k-space 1002 where effective TE echoes corresponding to refocusing pulses 1010 from a plurality of FASE pulse sequences 1008 are recorded. The echo signals corresponding to effective TE from each of the FASE pulse sequences 1012, 1014, 1016, 1018, and 1020 are mapped to the center k-space region as shown in the expanded view 1006 of center area 1004. As shown, the 2D FASE pulse sequence forms a pattern for variable refocusing flip angles such that the effective TE echo 1010 having a high SNR can be obtained while yet reducing SAR by elsewhere using smaller refocusing flip angles. In the illustrated embodiment, the refocusing pulses providing the three lines nearest the center of k-space were assigned the same high refocusing flip angle while the lines more removed from the center k-space have smaller angle RF refocusing pulses. However, any pattern including high (or highest) refocusing flip angle being in center k-space may be configured.

Figure 11:
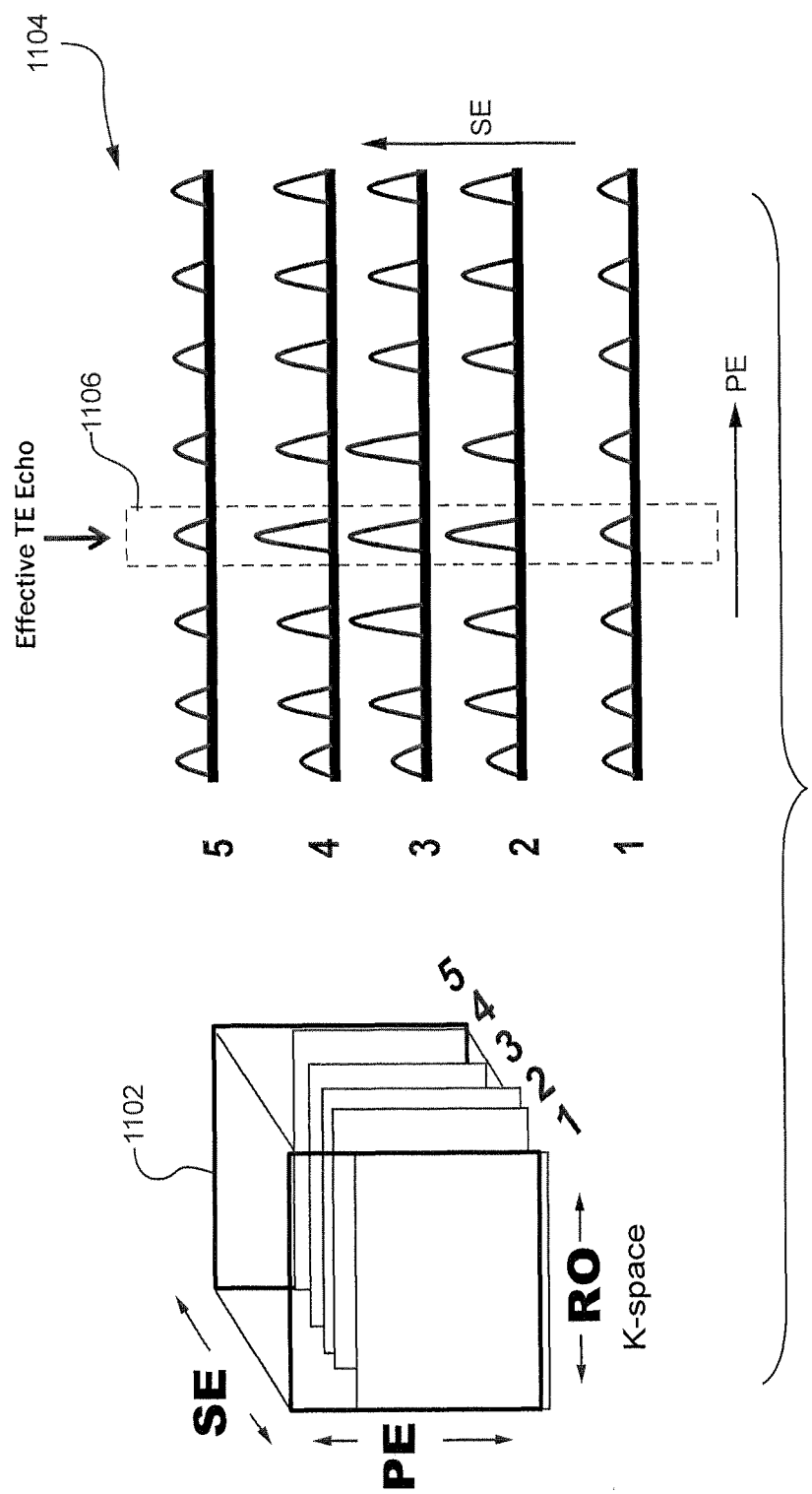
FIG. 11 illustrates a variable refocusing flip angle applied in three dimensions, in accordance with some embodiments.

FIG. 11 also schematically illustrates variable refocusing flip angles applied in both the phase encoding and slice encoding directions. In order to have a signal with sufficiently high SNR for blood, high refocusing flip angles are used for refocusing pulses that map their respective echoes to the center of k-space in both PE and SE directions. A k-space 1102 comprising five half-Fourier slices identified as slices 1-5. NMR echo signals corresponding to slices 1-5 are generated in response to FASE pulse sequences 1104 (i.e., echo trains responsive to FASE pulse trains 1, 2, 3, 4, and 5 are used to fill slices 1, 2, 3, 4, and 5, respectively, according to the half-Fourier technique).

Slice 3, is located in the center of k-space in the SE direction. Thus, the mid-point of slice 3 (i.e., the point of intersection, on a plane in slice 3, of mutually orthogonal axis from the mid-points of the PE direction and the readout RO direction) represents the center of 3D k-space. Accordingly, effective TE echo of slice 3 is encoded to the center of 3D k-space, and its corresponding refocusing pulse is configured to have the largest refocusing flip angle of the refocusing flip angles assigned to any of the refocusing pulses used on slices 1-5. Slices 2 and 4 are to either side of slice 3, and are therefore the closest, other than for slice 3, to the center of k-space in the SE direction. Therefore, in the embodiment illustrated in FIG. 11, the next largest (i.e., next largest compared to the refocusing pulse corresponding to the effective TE echo of slice 3) refocusing flip angle is assigned to one refocusing pulse to either side of the effective TE echo of slice 3 and the effective TE echoes of slices 2 and 4.

Moreover, the refocusing flip angles for refocusing pulses of slices 2-4, which are nearer the center of 3D k-space, are configured to be larger than the refocusing flip angles for refocusing pulses of slices 1 and 5. As noted above, the relative sizes of the refocusing flip angles are represented by the amplitudes of the corresponding echo signals. The 3D pattern of refocusing flip angles shown in FIG. 11 can be conceptualized as a stepped hill on the PE, SE "plane". As will be appreciated as the number of steps is increased, the containers of the "hill" become more smoothly changing.

RF pulse sequences 1104 for slices 1-5 may be configured, for example, as follows: all refocusing flip angles for slices 1 and 5 configured as 90 degrees; refocusing flip angles for slices 2 and 4 (except for the effective TE pulse) configured as 120 degrees; refocusing flip angles for slice 3 (except for effective TE pulse and one pulse to either side of the effective TE pulse) configured as 120 degrees; refocusing flip angles for effective TE pulse of slices 2 and 4 and for one pulse to either side of the effective TE pulse of slice 3 are configured as 150 degrees; and the effective TE pulse of slice 3 configured as 180 degrees. In an example embodiment, a k-space 702 may correspond to a 256×256×50 voxel scanned volume. Of course, due to the half-Fourier technique only part of that data need actually be acquired from the echo information.

Returning to FIG. 6, at operation 610, echo signals responsive to the applied pulse sequence(s) are collected. Persons of skill in the art will appreciate that operations 608 and 610 are performed in a manner that for any number of the pulse sequences applied, the corresponding responsive echo signals can be collected. In some embodiments, all echo data required for half-Fourier reconstruction is acquired by applying one pulse sequence separately for systole and diastole. In some other embodiments, more than one pulse sequence may be applied in order to obtain all echo data required for half-Fourier acquisition of k-space.

The acquisition stage, in some embodiments, results in a data set for an image captured in the systolic phase and a data set for an image captured in the diastolic phase of the same cardiac cycle. According to some embodiments, the systole and diastole echo signals are collected in separate memory areas, representing respective k-spaces (e.g., each capable of providing data for a complete, albeit non-final, MR image).

At operation 612 the diagnostic image is generated. The diagnostic image may be created by subtracting the systolic image, derived from the data set acquired for the systole, from the diastolic image derived from the data set acquired for the diastole, or vice versa.

At operation 614, the generated diagnostic image is output. The generated image may be displayed to an operator on a display of the MRI system and/or on a remote display, may be printed, may be stored on a local or remote data storage device, or may be provided for further MRI processing.

Figure 12:
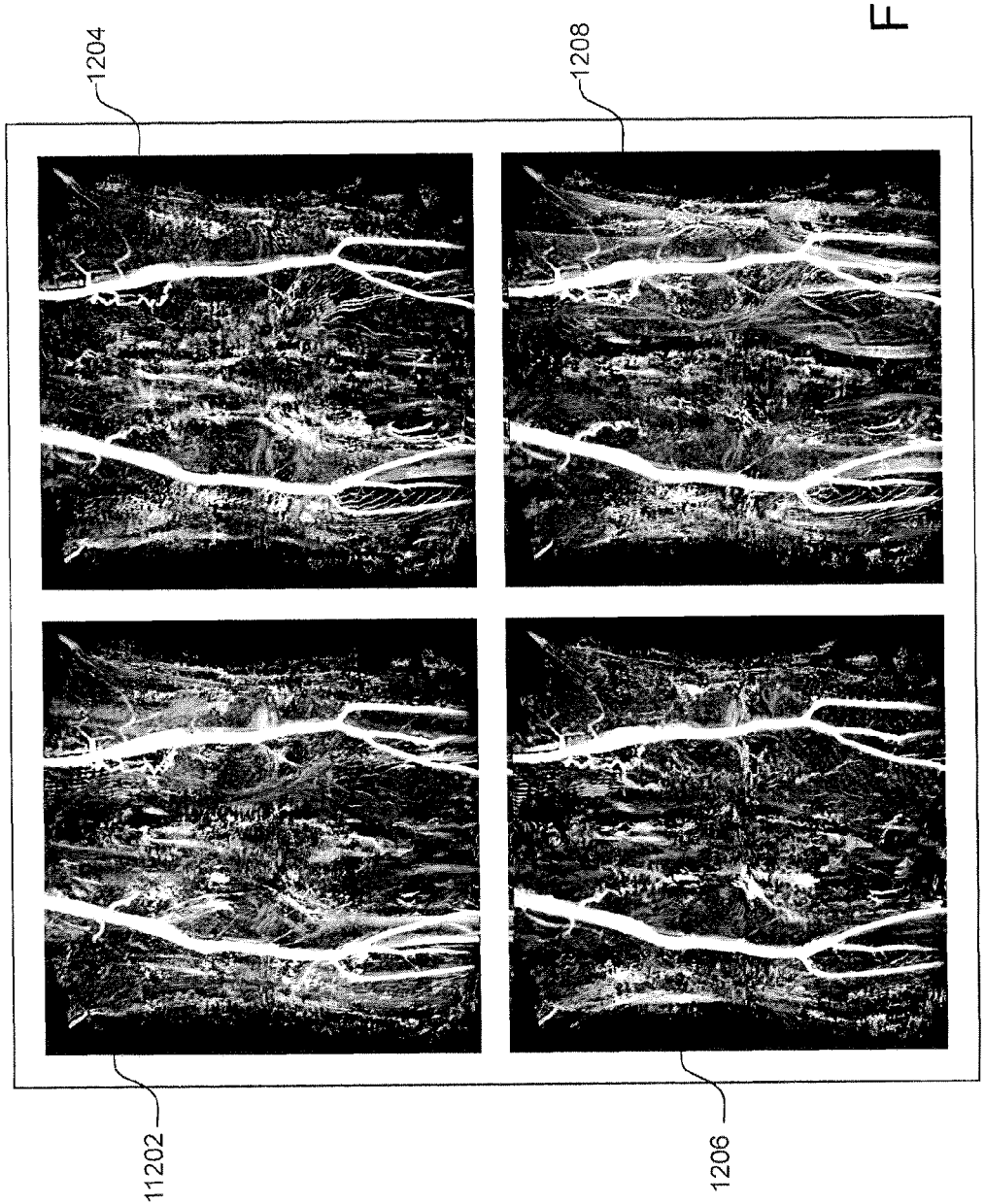
FIG. 12 illustrates exemplary FBI scans obtained conventionally and FBI scans acquired using variable TR in accordance with some embodiments.

FIG. 12 illustrates example FBI images from a healthy volunteer at calf station at 3T. The upper left image is obtained with a fixed TR interval of 3RR, and the upper right image with fixed 2RR, without using variable TR intervals. The bottom left image is acquired with 20% of slices at 3RR and 80% at 2RR, and the bottom right image is acquired with 40% of slices at 3RR with 60% at 2RR. The scan times for top left, top right, bottom left, and bottom right are 4:04, 2:42, 2:57 and 3:16 seconds, respectively. The bottom two images, which are obtained using variable TR intervals, are obtained in less time than the upper left image and have comparable signal quality to the upper images (e.g., the bottom images are of higher quality than the upper right image which, with the shortest scan time, also results in the weakest signal quality).

While certain embodiments have been described, these embodiments have been presented by way of example only and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging (MRI) system comprising:
    an MRI gantry having components including a static magnetic field generator, gradient magnetic field coils, at least one radio frequency (RF) coil configured to couple with an object located in an imaging volume, at least one RF transmitter and at least one RF receiver;
    an MRI sequence controller configured to control said gantry components so as to effect imaging of a volume by:
        eliciting readout sequences of nuclear magnetic resonance (NMR) echoes, from the object, which map to a k-space having phase-encoded (PE) and slice-encoded (SE) dimensions;
        said readout sequences of NMR echoes being elicited by respectively corresponding single-shot RF pulse sequences that each have an excitation RF pulse followed by plural refocusing RF pulses; and
        said single-shot RF pulse sequences have variable repetition time (TR) intervals in at least one of the PE and SE dimensions, wherein said TR intervals are longer when eliciting NMR echoes for a center portion of k-space than TR intervals used to elicit NMR echoes elsewhere in k-space, and
    at least one digital data processor configured to reconstruct a diagnostic image from said elicited readout sequences of NMR echoes.

2. The MRI system of claim 1, wherein at least one of (1) a number of slices in k-space representing said center portion of k-space, or (2) a number of k-space lines representing said center portion of k-space is configurable.

3. The MRI system of claim 1, wherein said variable TR intervals include at least three different TR interval lengths where a third TR interval length of an intermediate imaging slice located in the 3D volume between a first imaging slice in a center portion of k-space having a first TR interval length and a second imaging slice in a peripheral portion having a second TR interval length, is longer than the first TR interval length and shorter than the second TR interval length.

4. The MRI system of claim 3, wherein said at least three different TR interval lengths are configurable.

5. The MRI system of claim 3, wherein a number of slices in the center portion is configurable.

6. The MRI system of claim 1, wherein said refocusing RF pulses have variable flip angles in at least one of the PE and SE dimensions.

7. The MRI system of claim 6, wherein said refocusing RF pulses have larger flip angles when eliciting NMR echoes for a center portion of k-space than flip angles used to elicit NMR echoes elsewhere in k-space.

8. The MRI system of claim 7, wherein said variable TR intervals are longer when eliciting NMR echoes for a center portion of k-space than TR intervals used to elicit NMR echoes elsewhere in k-space.

9. The MRI system according to claim 1, wherein the respectively corresponding single-shot RF pulse sequences include plural first RF pulse sequences applied to the object during a first cardiac phase and plural second RF pulse sequences applied to the object during a second cardiac phase, said first and second plural RF pulse sequences having a same pattern of variable TR intervals, wherein the same pattern includes at least two different variable TR interval lengths, and wherein systolic readout sequences are responsive to the plural first pulse sequences and diastolic readout sequences are responsive to the plural second pulse sequences, the systolic and diastolic readout sequences being involved in the readout sequences,
    wherein the at least one digital data processor is configured to receive first data sets of k-space mapped digital data corresponding to said NMR echoes responsive to the first RF pulse sequences and second data sets of k-space mapped digital data corresponding to said NMR echoes responsive to the second RF pulse sequences, and
    wherein the diagnostic image is reconstructed based upon the first data sets and the second data sets.

10. The MRI system of claim 9, wherein the RF pulse sequences comprise 3D Fast Advanced Spin Echo (3D FASE) or 3D single-shot Fast Spin Echo (3D SS-F SE) pulse sequences in combination with a half-Fourier technique for acquiring k-space data.

11. The MRI system of claim 10, wherein the RF pulse sequences further comprise flow-spoiled readout gradients.

12. The MRI system of claim 1, wherein the respectively corresponding single-shot RF pulse sequences are applied without infusing the object with a contrast agent, and wherein the diagnostic image provides a "bright blood" image.

13. A magnetic resonance imaging (MRI) method for effecting non-contrast magnetic resonance angiography (NC-MRA) imaging of a three dimensional (3D) volume, the method comprising:

eliciting readout sequences of nuclear magnetic resonance (NMR) echoes, from an object, which map to a k-space having phase-encoded (PE) and slice-encoded (SE) dimensions;

said readout sequences of NMR echoes being elicited by respectively corresponding single-shot RF pulse sequences that each have an excitation RF pulse followed by plural refocusing RF pulses; and said single-shot RF pulse sequences have variable repetition time (TR) intervals in at least one of the PE and SE dimensions, wherein said TR intervals are longer when eliciting NMR echoes for a center portion of k-space than TR intervals used to elicit NMR echoes elsewhere in k-space, and reconstructing a diagnostic image from said elicited readout sequences of NMR echoes.

14. The MRI method of claim 13, wherein at least one of (1) a number of slices in k-space representing said center portion of k-space, or (2) a number of k-space lines representing said center portion of k-space is configurable.

15. The MRI method of claim 13, wherein said variable TR intervals include at least three different TR interval lengths where a third TR interval length of an intermediate imaging slice located in the 3D volume between a first imaging slice in a center portion of k-space having a first TR interval length and a second imaging slice in a peripheral portion having a second TR interval length, is longer than the first TR interval length and shorter than the second TR interval length.

16. The MRI method of claim 15, wherein said at least three different TR interval lengths are configurable.

17. The MRI method of claim 15, wherein a number of slices in the center portion is configurable.

18. The MRI method of claim 13, wherein said refocusing RF pulses have variable flip angles in at least one of the PE and SE dimensions.

* * * * *